(12) United States Patent
Yoshino et al.

(10) Patent No.: US 10,876,985 B2
(45) Date of Patent: Dec. 29, 2020

(54) SHEET SENSOR

(71) Applicant: TATSUTA ELECTRIC WIRE & CABLE CO., LTD., Osaka (JP)

(72) Inventors: Shinji Yoshino, Kyoto (JP); Keisho Shinohara, Kyoto (JP)

(73) Assignee: TATSUTA ELECTRIC WIRE & CABLE CO., LTD., Osaka (JP)

(*) Notice: Subject to any disclaimer, the term of this patent is extended or adjusted under 35 U.S.C. 154(b) by 175 days.

(21) Appl. No.: 16/129,434

(22) Filed: Sep. 12, 2018

(65) Prior Publication Data

US 2019/0086285 A1 Mar. 21, 2019

(30) Foreign Application Priority Data

Sep. 19, 2017 (JP) ................. 2017-179108

(51) Int. Cl.

| | |
|---|---|
| *G01N 27/04* | (2006.01) |
| *H01B 1/02* | (2006.01) |
| *G01M 3/04* | (2006.01) |
| *G01M 3/16* | (2006.01) |
| *G08B 21/20* | (2006.01) |
| *G01N 27/12* | (2006.01) |

(Continued)

(52) U.S. Cl.
CPC .......... *G01N 27/048* (2013.01); *G01M 3/045* (2013.01); *G01M 3/16* (2013.01); *G01M 3/165* (2013.01); *G01N 27/12* (2013.01); *G01N 27/121* (2013.01); *G08B 21/20* (2013.01); *H01B 1/02* (2013.01); *G01R 1/0408* (2013.01); *H01R 13/2414* (2013.01)

(58) Field of Classification Search
CPC .... G01M 3/045; G01M 3/165; G01N 27/048; G01N 27/12; G01N 27/121–124; G01R 1/0408; H01B 1/02; H01B 1/026; H01R 4/04; H01R 11/01; H01R 13/2414; G08B 21/20

See application file for complete search history.

(56) References Cited

U.S. PATENT DOCUMENTS

| | | | |
|---|---|---|---|
| 4,313,338 A | * | 2/1982 | Abe ........................ G01N 27/12 338/34 |
| 5,313,840 A | | 5/1994 | Chen et al. |

(Continued)

FOREIGN PATENT DOCUMENTS

| | | |
|---|---|---|
| CN | 1438077 A | 8/2003 |
| CN | 101308264 A | 11/2008 |

(Continued)

OTHER PUBLICATIONS

Chinese Office Action (CNOA) dated Jun. 30, 2020 for the corresponding Chinese Patent Application No. 201811080545.2 and its English machine translation.

(Continued)

*Primary Examiner* — Peter J Macchiarolo
*Assistant Examiner* — Fatemeh Esfandiari Nia
(74) *Attorney, Agent, or Firm* — Rankin, Hill & Clark LLP

(57) ABSTRACT

Provided is a sheet sensor comprising an anisotropically-conductive sheet exhibiting conductivity in a thickness direction and having a first surface as a contact surface for a sensing target object, and multiple conductive members electrically connected to a second surface of the anisotropically-conductive sheet and electrically insulated from each other.

9 Claims, 14 Drawing Sheets

(51) Int. Cl.
*G01R 1/04* (2006.01)
*H01R 13/24* (2006.01)

(56) References Cited

U.S. PATENT DOCUMENTS

| | | | |
|---|---|---|---|
| 7,267,559 B2* | 9/2007 | Hashitani | G01R 1/06755 |
| | | | 439/91 |
| 7,368,149 B2 | 5/2008 | Katagami | |
| 8,124,885 B2* | 2/2012 | Yamada | H01R 12/7082 |
| | | | 174/262 |
| 2003/0011482 A1* | 1/2003 | Harms | G08B 21/20 |
| | | | 340/605 |
| 2003/0190419 A1 | 10/2003 | Katagami et al. | |
| 2006/0032761 A1* | 2/2006 | Oguri | G08B 21/20 |
| | | | 205/788 |
| 2006/0051498 A1 | 3/2006 | Katagami et al. | |
| 2007/0090704 A1 | 4/2007 | Chen | |
| 2008/0284934 A1 | 11/2008 | Umezaki et al. | |
| 2009/0159325 A1 | 6/2009 | Yamada et al. | |
| 2015/0219520 A1* | 8/2015 | Yu | G01M 3/165 |
| | | | 73/40 |
| 2016/0166757 A1* | 6/2016 | Koyama | G01N 27/08 |
| | | | 324/693 |
| 2016/0282216 A1* | 9/2016 | Lee | G01M 3/16 |
| 2020/0217746 A1* | 7/2020 | Woodbury | G01N 27/06 |

FOREIGN PATENT DOCUMENTS

| | | | | |
|---|---|---|---|---|
| CN | 101449426 A | | 6/2009 | |
| CN | 104769423 A | | 7/2015 | |
| CN | 106645300 A | | 5/2017 | |
| JP | 57066336 A | | 4/1982 | |
| JP | 6-258007 A | | 9/1994 | |
| JP | 200773390 A | * | 1/1995 | |
| JP | H0714480 A | * | 3/2007 | |
| JP | 2007143895 A | | 6/2007 | |
| JP | 5722257 B2 | | 5/2015 | |
| JP | 2017-20817 A | | 1/2017 | |
| WO | WO-2013187336 A1 | * | 12/2013 | G01M 3/165 |

OTHER PUBLICATIONS

Japanese Office Action (JPOA) dated Jul. 10, 2020 for the corresponding Japanese Patent Application No. 2017-179108 and its English machine translation.

* cited by examiner

SHEET SENSOR

CROSS-REFERENCE TO RELATED APPLICATION

This application claims priority from Japanese Patent Application No. 2017-179108 filed with the Japan Patent Office on Sep. 19, 2017, the entire contents of which are hereby incorporated by reference.

BACKGROUND

1. Technical Field

The present disclosure relates to a sheet sensor.

2. Related Art

Conventionally, a pair of metal net-shaped sheets has been proposed as a liquid sensing sheet used for a sensor configured to sense water leakage. Moreover, a liquid sensing sheet has been also proposed, which is integrated in such a manner that a peripheral edge portion of a stack of water-permeable insulating, sheets connecting, between electrode tapes is bonded with an adhesive (JP 2007-143895 A and JP 57-66336 A). Moreover, a liquid sensing sheet as another example has been also proposed, which includes an insulating sheet exhibiting conductivity by liquid and having a liquid-permeable structure and conductive sheets connected to both surfaces of the insulating sheet. At least one of the conductive sheets has a penetration portion through which the liquid passes. The insulating sheet and the conductive sheets are connected by an adhesive arranged dispersively across the entirety of a bonding surface (JP 5722257 B).

SUMMARY

A sheet sensor according to an embodiment of the present disclosure comprises an anisotropically-conductive sheet exhibiting conductivity in a thickness direction and having a first surface as a contact surface for a sensing target object, and multiple conductive members electrically connected to a second surface of the anisotropically-conductive sheet and electrically insulated from each other.

DETAILED DESCRIPTION

Figure 1:
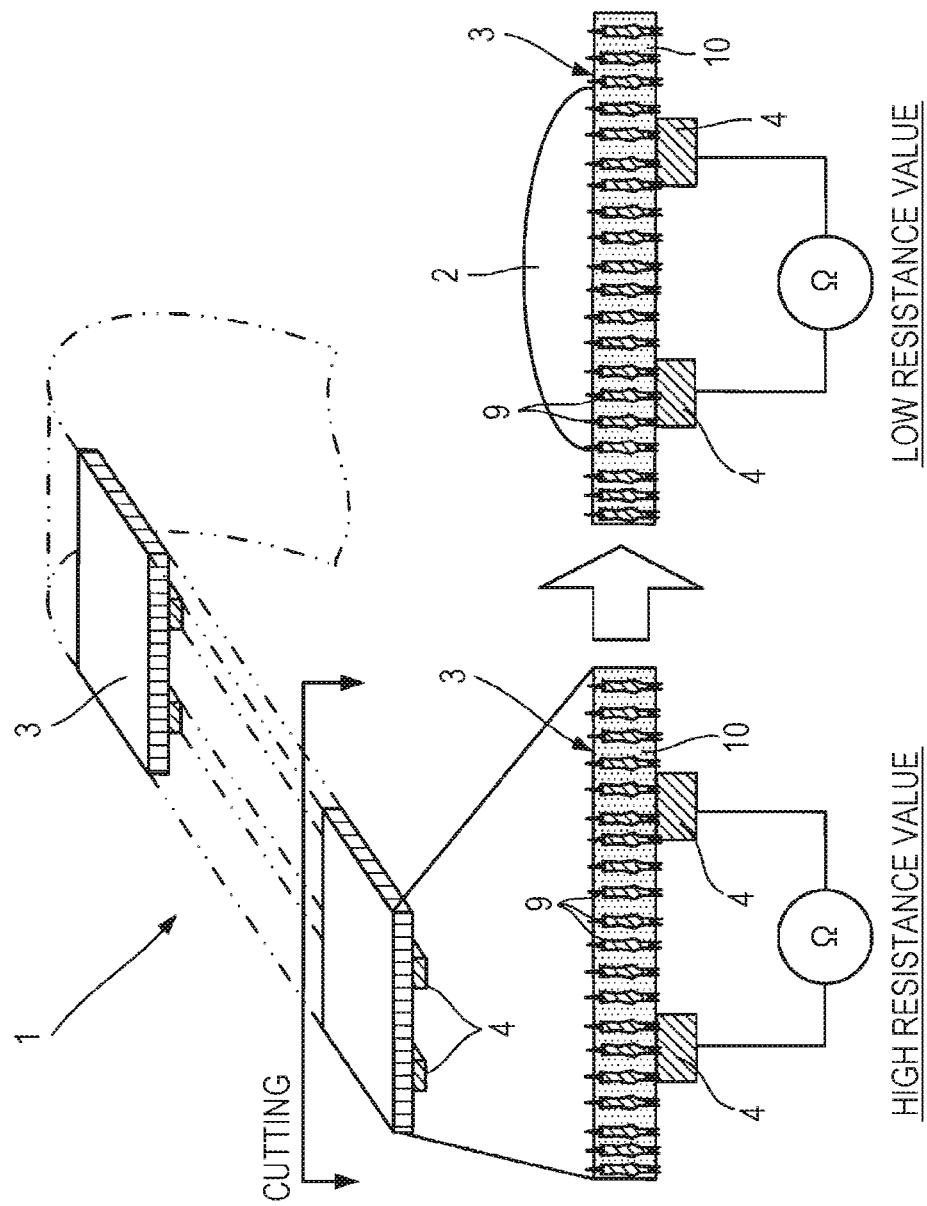
FIG. 1 is a view for describing a liquid sensing sheet.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

As described above, the liquid sensing sheets having various configurations have been conventionally proposed. For cost reduction, a smaller number of components of the liquid sensing sheet and a simple configuration of the liquid sensing sheet have been demanded.

A liquid sensing sheet of the present embodiment has been developed in view of the above-described problems. That is, the present disclosure is intended to provide a sheet sensor having a smaller number of components and a simple configuration.

The sheet sensor of the present disclosure includes an anisotropically-conductive sheet exhibiting conductivity in a thickness direction thereof, and multiple conductive members. The anisotropically-conductive sheet has a first surface as a contact surface for a sensing target object. The multiple conductive members are electrically connected to a second surface of the anisotropically-conductive sheet, and are electrically insulated from each other.

According to the above-described configuration, when the conductive sensing target object contacts the first surface of the anisotropically-conductive sheet, the multiple conductive members electrically insulated from each other are electrically connected to each other via the anisotropically-conductive sheet and the sensing target object. Thus, the sheet sensor can be obtained, which is configured to sense the sensing target object based on an increase/decrease in electric resistance between the conductive members. The sheet sensor has a smaller number of components including the anisotropically-conductive sheet and the conductive members, and has a simple configuration.

The conductive members in the present disclosure are each formed linearly, and are arranged in parallel. A parallel direction of the conductive members (the direction of arranging the conductive members in parallel) and the direction of extending the linear conductive members may be perpendicular to each other.

According to the above-described configuration, a substantially uniform sectional structure is provided along the direction of extending the linear conductive members. Thus, the sheet sensor can be cut to a desired length at an optional position in the direction of extending the conductive members. Moreover, at the second surface of the anisotropically-conductive sheet, all contact portions between each conductive member and the anisotropically-conductive sheet are electrically exposed. Thus, optional positions of the contact portions between each conductive member and the anisotropically-conductive sheet can be utilized as sensing contact points.

The conductive members used in the present embodiment may be each formed linearly, and may be arranged in parallel from one end side to the other end side in a width direction of the anisotropically-conductive sheet.

According to the above-described configuration, two selected groups of one or more conductive members are used as the sensing contact points so that the sensing target object at an optional position in a planar direction can be sensed.

The first surface of the anisotropically-conductive sheet used in the present embodiment may exhibit hydrophilic properties.

According to the above-described configuration, in a case where the sensing target object is water, the water adhering to the first surface of the anisotropically-conductive sheet expands in a planar shape. Thus, even a small amount of water can be sensed.

A layer including non-woven fabric may be formed on the first surface of the anisotropically-conductive sheet used in the present embodiment.

According to the above-described configuration, when liquid as the sensing target object adheres to the layer including the non-woven fabric on the first surface of the anisotropically-conductive sheet, the liquid expands due to capillarity of the non-woven fabric. Thus, even a small amount of water can be sensed.

Slits extending in a direction crossing the direction of extending the linear conductive members may be formed at the first surface of the anisotropically-conductivesheet used in the present embodiment.

According to the above-described configuration, when the liquid as the sensing target object adheres to the first surface of the anisotropically-conductive sheet, the liquid flows along the slits. Then, the water expands in the direction crossing the direction of extending the conductive members. Consequently, even a small amount of liquid can be sensed.

The anisotropically-conductive sheet used in the present embodiment may be formed in a recessed shape to have a top portion between the conductive members.

According to the above-described configuration, the liquid as the sensing target object flows along a recessed wall surface of the anisotropically-conductive sheet, and is accumulated in the top portion. Thus, the liquid can be sensed over a longer period of time as compared to a case where the liquid flows out of the anisotropically-conductive sheet.

The sheet sensor of the present embodiment may have an insulating sheet connected to the second surface of the anisotropically-conductive sheet, the conductive members being sandwiched between the anisotropically-conductive sheet and the insulating sheet.

According to the above-described configuration, even in a case where portions of a sheet sensor placement target contacting the conductive members are made of a material exhibiting conductivity, the insulating sheet ensures insulating properties between the conductive members. Thus, the degree of freedom in selection of the placement target can be increased.

At least part of each conductive member used in the present embodiment may be embedded in the anisotropically-conductive sheet.

According to the above-described configuration, the conductive members are held and fixed by the anisotropically-conductive sheet. Thus, strength against vibration and impact can be enhanced.

The conductive members used in the present embodiment may contact each other via an insulating film.

According to the above-described configuration, a clearance between the conductive members can be narrowed to the thickness of the insulating film. Thus, the size of the sheet sensor can be reduced.

The anisotropically-conductive sheet used in the present embodiment may include sheet-shaped insulating resin containing multiple conductive particles arranged dispersively. In this case, first and second portions of each conductive particle may be exposed at the first and second surfaces of the anisotropically-conductive sheet.

According to the above-described configuration, the sheet sensor can be obtained only by the simple processing of connecting the conductive members to the anisotropically-conductive sheet without performing processing such as heating or pressurizing for the anisotropically-conductive sheet to move the conductive particles in a pressurizing direction and cause the conductive particles to contact each other.

The sheet sensor of the present embodiment includes a pair of anisotropically-conductive sheets exhibiting conductivity in the thickness direction and stacked on each other in the thickness direction, and multiple conductive members arranged between the anisotropically-conductive sheets. The conductive members are electrically connected to the anisotropically-conductive sheets, and are electrically insulated from each other.

According to the above-described configuration, when the conductive sensing target object contacts at least one surface of the sheet sensor, the multiple conductive members electrically insulated from each other are electrically connected to each other via the anisotropically-conductive sheets and the sensing target object. Thus, the sheet sensor can be obtained, which is configured to sense the sensing target object based on an increase/decrease in the electric resistance between the conductive members. Moreover, the sheet sensor has a smaller number of components including the anisotropically-conductive sheets and the conductive members, and has a simple configuration.

Hereinafter, a preferred embodiment will be described with reference to the drawings.

(Sheet Sensor 1: Entire Configuration)

As illustrated in FIG. 1, a sheet sensor 1 includes an anisotropically-conductive sheet 3 exhibiting conductivity in a thickness direction thereof, and multiple conductive members 4. The anisotropically-conductive sheet has a first surface as a contact surface for a sensing target object 2. The multiple conductive members 4 are electrically connected to a second surface of the anisotropically-conductive sheet 3, and are electrically insulated from each other.

The "sensing target object 2" described herein may be a non-insulating body (e.g., conductive rubber, conductive resin, conductive paint, or metal j. Examples of the sensing target object 2 may include liquid, conductive powder, a metal member such as an iron sheet, a human body, an animal, a plant, and a semiconductor (e.g., an electronic component and a wafer). As long as the "liquid" described as an example is in the form of liquid, material and physical properties thereof are not specifically limited. More specific examples of the "liquid" include pure water, water containing an impurity, acid, and alkali. The "liquid" may exhibit properties observed in a liquefied substance under an environment temperature upon use of the sheet sensor 1.

When the conductive sensing target object 2 such as the liquid contacts the first surface of the anisotropically-conductive sheet 3, the multiple conductive members 4 electrically insulated from each other are, in the sheet sensor 1 configured as described above, electrically connected to each other via the anisotropically-conductive sheet 3 and the sensing, target object 2. Thus, the sheet sensor 1 can sense, with a small number of components including the anisotropically-conductive sheet 3 and the conductive members 4 and a simple configuration, the sensing target object 2 based on an increase/decrease in an electric resistance value between the conductive members 4.

Figure 2:
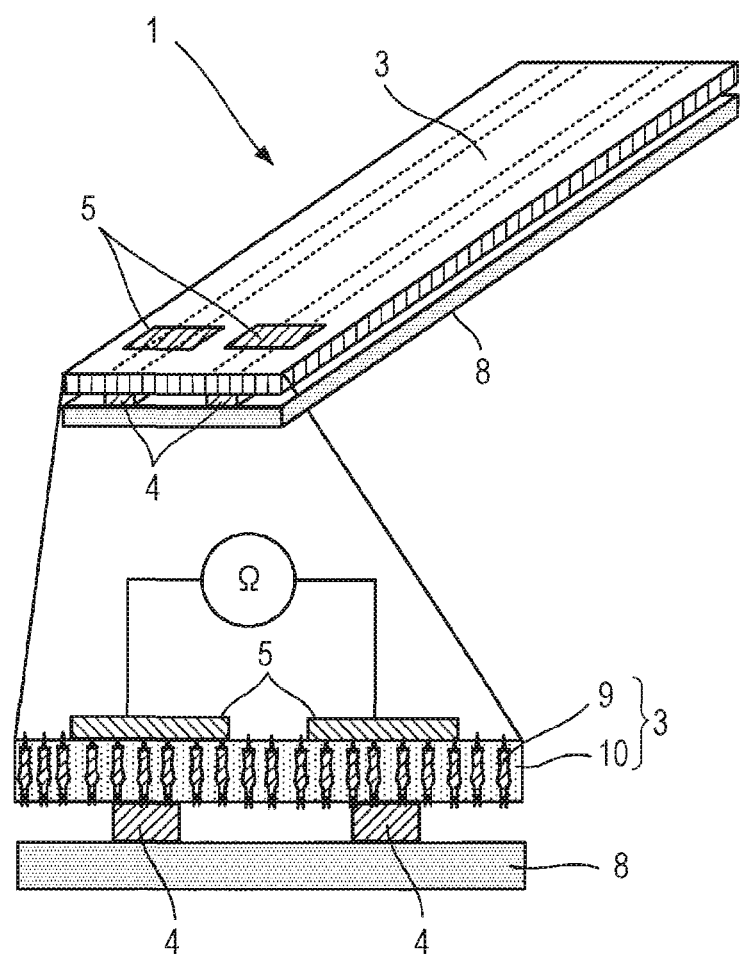
FIG. 2 is a view for describing a liquid sensing sheet including an insulating sheet.

Note that as illustrated in FIG. 2, the sheet sensor 1 may have an insulating sheet 8 connected to the second surface of the anisotropically-conductive sheet 3 with the conductive members 4 being sandwiched between the insulating sheet 8 and the anisotropically-conductive sheet 3. The insulating sheet 8 may be formed from paper or non-woven fabric. Examples of a material forming the insulating sheet 8 may include epoxy-based resin, polyester-based resin, acrylic-based resin, phenol-based resin, urethane-based resin, nylon-based resin, and a mixture thereof. In this case, even when portions of a placement target of the sheet sensor 1 contacting the conductive members 4 are made of a material exhibiting conductivity, the insulating sheet 8 ensures insulating properties between the conductive members 4. Thus, the degree of freedom in selection of the placement target can be increased.

Figure 3:
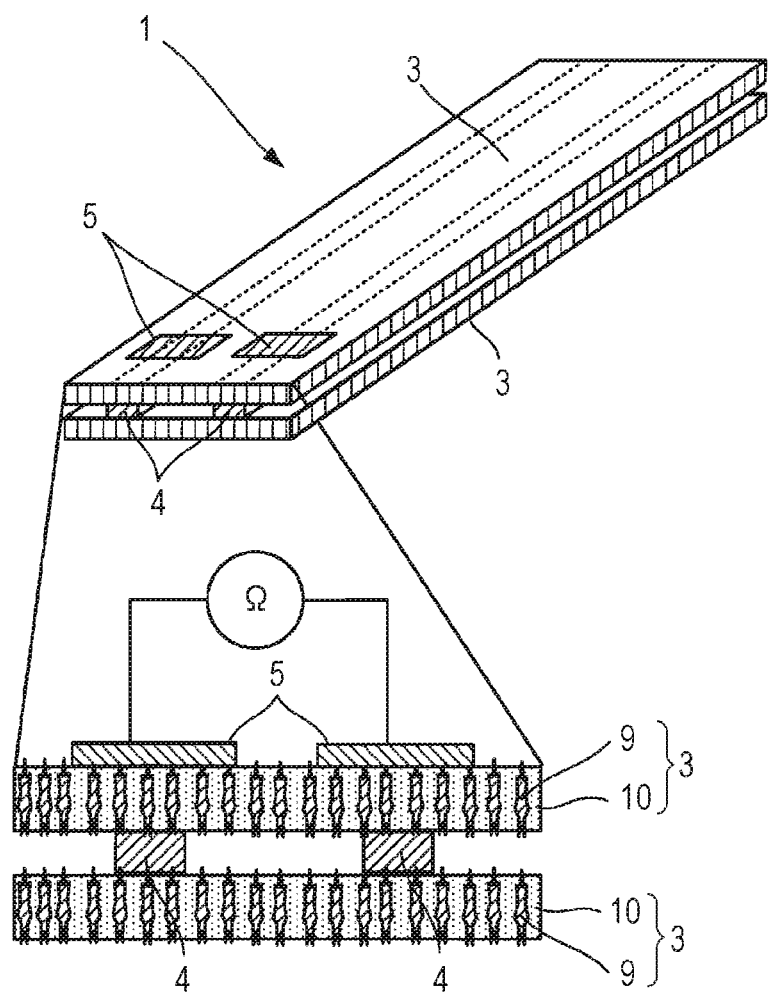
FIG. 3 is a view for describing a liquid sensing sheet including a pair of anisotropically-conductive sheets.

Alternatively, the sheet sensor 1 may have a configuration in which the insulating sheet 8 is replaced with the anisotropically-conductive sheet 3. That is, in this configuration, the sheet sensor 1 is configured such that the second surfaces of the anisotropically-conductive sheets 3 are connected to each other and the conductive members 4 are arranged between the pair of anisotropically-conductive sheets 3 as illustrated in FIG. 3. In other words, the sheet sensor 1 may have the pair of anisotropically-conductive sheets 3 exhibiting, the conductivity in the thickness direction and stacked on each other in the thickness direction, and the multiple conductive members 4 arranged between the anisotropically-conductive sheets 3. In this case, the conductive members 4 are electrically connected to the anisotropically-conductive sheets 3, and are electrically insulated from each other. In this case, the sensing target object 2 can be sensed at both surfaces of the sheet sensor 1.

(Sheet Sensor 1: Anisotropically-Conductive Sheet 3)

As illustrated in FIG. 1, the anisotropically-conductive sheet 3 may include sheet-shaped insulating resin 10 containing multiple conductive particles 9 arranged dispersively. In this case, first and second portions of each conductive particle 9 are exposed on the first and second surfaces of the anisotropically-conductive sheet 3. In other words, the anisotropically-conductive sheet 3 has such a configuration that the conductive particles 9 are exposed on both surfaces of the sheet made of the insulating resin 10 by setting of a smaller thickness of the insulating resin 10 than the average particle size of the conductive particles 9. With this configuration, the sheet sensor 1 can be formed only by the simple processing of connecting the conductive members 4 to the anisotropically-conductive sheet 3 without performing processing such as heating or pressurizing for the anisotropically-conductive sheet 3 to move the conductive particles 9 in a pressurizing direction and cause the conductive particles 9 to contact each other.

Examples of the insulating resin 10 may include thermoplastic resin such as polystyrene-based resin, vinyl acetate-based resin, polyester-based resin, polyethylene-based resin, polypropylene-based resin, polyamide-based resin, rubber-based resin, and acrylic-based resin, and thermosetting resin such as phenol-based resin, epoxy-based resin, urethane-based resin, melamine-based resin, and alkyd-based resin. Note that the insulating resin 10 may be one or a mixture of the above-described resins. Alternatively, the insulating resin 10 may contain a tackifier. Examples of the tackifier include tackifiers such as fatty hydrocarbon resin, a C5/C9 resin mixture, rosin, a rosin derivative, terpene resin, aromatic hydrocarbon resin, and thermal reactive resin.

Part or the entirety of the conductive particle 9 is made of a metal material. Examples of the conductive particle 9 include copper powder, silver powder, nickel powder, silver-coated copper powder (Ag-coated Cu powder), gold-coated copper powder, silver-coated nickel powder (Ag-coated Ni powder), and gold-coated nickel powder. These metal powders can be prepared by an atomizing process or a carbonyl process. In addition to above, metal powder particles covered with resin or resin particles covered with metal powder may be used. Further, one or more types of conductive particles 9 may be mixed with and added to the insulating resin 10. Note that the conductive particle 9 is preferably the Ag-coated Cu powder or the Ag-coated Ni powder. This is because conductive particles exhibiting stable conductivity can be obtained by means of an inexpensive material.

The shape of the conductive particle 9 may be any of a spherical shape, a needle shape, a fiber shape, a flake shape, and a dendrite shape. Specifically, such a shape is preferably the dendrite shape. This is because a pointed top portion easily protrudes from the surface of the insulating resin 10 in the case of the conductive particle 9 in the dendrite shape.

Examples of the method for forming the sheet sensor 1 may include a method including applying, in a sheet shape with a uniform thickness, liquid conductive ink containing a mixture of the above-described conductive particles 9 and the insulating resin 10 such that a thickness after drying is coincident with the thickness of the anisotropically-conductive sheet 3 and subsequently drying the applied ink. In a case where the thickness after drying is smaller than the average particle size of the conductive particles 9 and the conductive particles 9 are the dendrite-shaped particles, the pointed top portion of each conductive particle 9 protrudes from the surface of the insulating resin 10 in the course of drying. In this manner, the anisotropically-conductive sheet 3 can be easily obtained.

Note that in the present embodiment, the anisotropically-conductive sheet 3 configured such that each conductive particle 9 exhibits the anisotropic conductivity in the thickness direction due to protrusion of the first and second portions of each conductive particle 9 from the sheet-shaped insulating resin 10 has been described as an example. Note that the anisotropically-conductive sheet 3 used in the present embodiment is not limited to this example. That is, the anisotropically-conductive sheet 3 may exhibit the anisotropic conductivity in the thickness direction due to contact among the multiple conductive particles 9 in the thickness direction. In this case, the thickness of the anisotropically-conductive sheet 3 can be more freely set without limitations on the particle size of the conductive particle 9.

Figure 4:
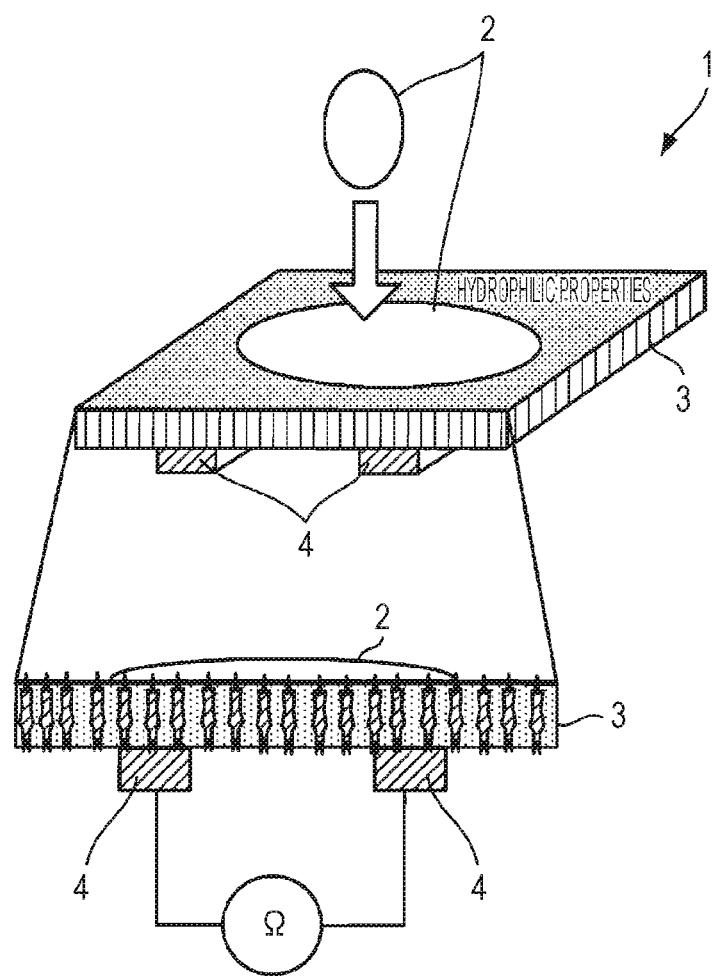
FIG. 4 is a view for describing a liquid sensing sheet exhibiting hydrophilic properties.

As illustrated in FIG. 4, the anisotropically-conductive sheet 3 may exhibit hydrophilic properties or lyophilic properties of the first surface as the contact surface for the sensing target object 2. In this case, when the sensing target object 2 is water or the liquid, the water or liquid adhering to the first surface of the anisotropically-conductive sheet 3 expands in a planar shape. Thus, even a small amount of water or liquid can be sensed.

The hydrophilic properties of the anisotropically-conductive sheet 3 are realized by hydrophilic processing such as a surfactant, surface modification, nanoimprint, or roll imprint. Examples of surface modification include frame processing, plasma processing, ion processing, ozone processing, primer processing, discharge processing, and graft polymerization.

Figure 5:
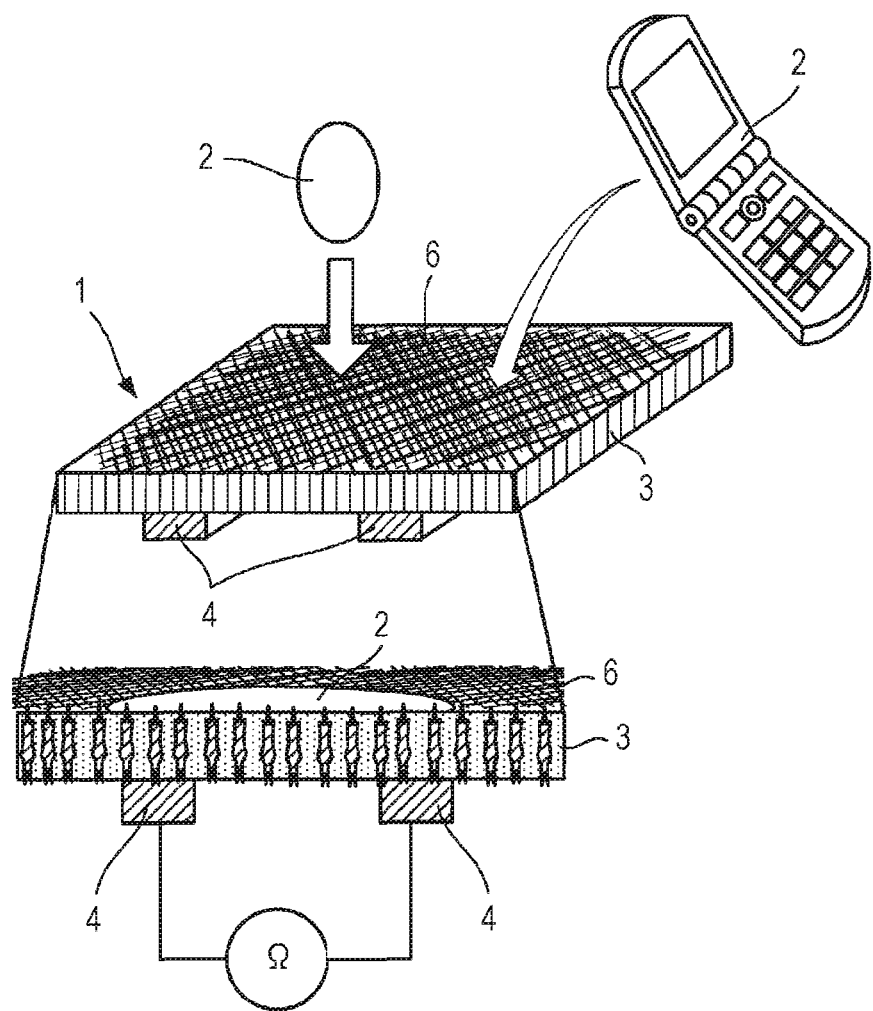
FIG. 5 is a view for describing a liquid sensing sheet having a non-woven fabric layer.

As illustrated in FIG. 5, a non-woven fabric layer 6 formed from non-woven fabric may be formed on the first surface of the anisotropically-conductive sheet 3. In this case, when the sensing target object 2 is the liquid, if the liquid adheres to the non-woven fabric layer 6 on the first surface of the anisotropically-conductive sheet 3, the liquid expands due to capillarity of the non-woven fabric. Thus, even a small amount of water can be sensed. Moreover, conduction of the solid sensing target object 2 such as a mobile phone is inhibited by the non-woven fabric. Thus, only the liquid sensing target object 2 can be selectively sensed.

A material of the non-woven fabric is not specifically limited as long as the material has great electric resistance upon non-contact with the liquid. Specific examples include cellulose such as fabric and paper, ceramic, and engineering plastic. Examples of the engineering plastic include polypropylene, cross-linked polyethylene, polyester, polybenzimidazole, aramid, polyimide, polyimide-amide, polyether imide, polyphenylene sulfide (PPS), and polyethylene naphthalate (PEN).

More specifically; non-woven fabric made of polyester resin manufactured by Unitika Ltd. (the registered trademark: MARIX) can be used as the non-woven fabric layer 6. The resin of the non-woven fabric for bonding polyester fibers is water-soluble binder resin. Thus, the non-woven fabric exhibits favorable hydrophilic properties.

Moreover, the non-woven fabric preferably exhibits lyophilic properties in the liquid as the sensing target object 2. For example, when the liquid is water, the lyophilic properties are referred to as "hydrophilic properties." In the configuration with the non-woven fabric exhibiting the lyophilic properties, even a slight amount of liquid penetrates into the non-woven fabric layer 6, and therefore, an insulating state of the non-woven fabric layer 6 is changed to a conduction state. Thus, the sheet sensor 1 configured so that even a small amount of liquid can be sensed or a time until sensing can be shortened can be obtained.

Note that the non-woven fabric may be non-woven fabric whose material itself exhibits lyophilic properties, or non-woven fabric having a lyophilic layer formed on a surface of a lyophobic material. For example, the non-woven fabric may be configured such that a surfactant exhibiting surface action for the liquid adheres to at least part of a non-woven fabric portion contacting the liquid. In this case, the type of surfactant is differently used according to the type of liquid as the sensing target so that the sheet sensor 1 configured to selectively sense the sensing target object 2 such as water or the liquid can be obtained.

Further, the non-woven fabric layer 6 may have a coloring member whose color is changeable by the liquid. Examples of the coloring member may include a sealed capsule holding a colorant such as a dye inside. This capsule is made of a material soluble in water or the liquid as the sensing target object. In this case, when the capsule is dissolved in the liquid as the sensing target object, the colorant flows out of the sealed capsule to change the color of the sheet sensor 1. Thus, the sheet sensor 1 configured to visually sense liquid leakage can be obtained.

Further, the non-woven fabric layer 6 may have a soluble material ionized by dissolving in the liquid. Examples of the soluble material may include inorganic salts such as sodium chloride, sodium sulfate, calcium chloride, and magnesium hydroxide. In this case, even when the sensing target object s liquid (pure water etc.) exhibiting no conductivity, such liquid can be changed to have conductivity by the ionized soluble material.

Figure 6:
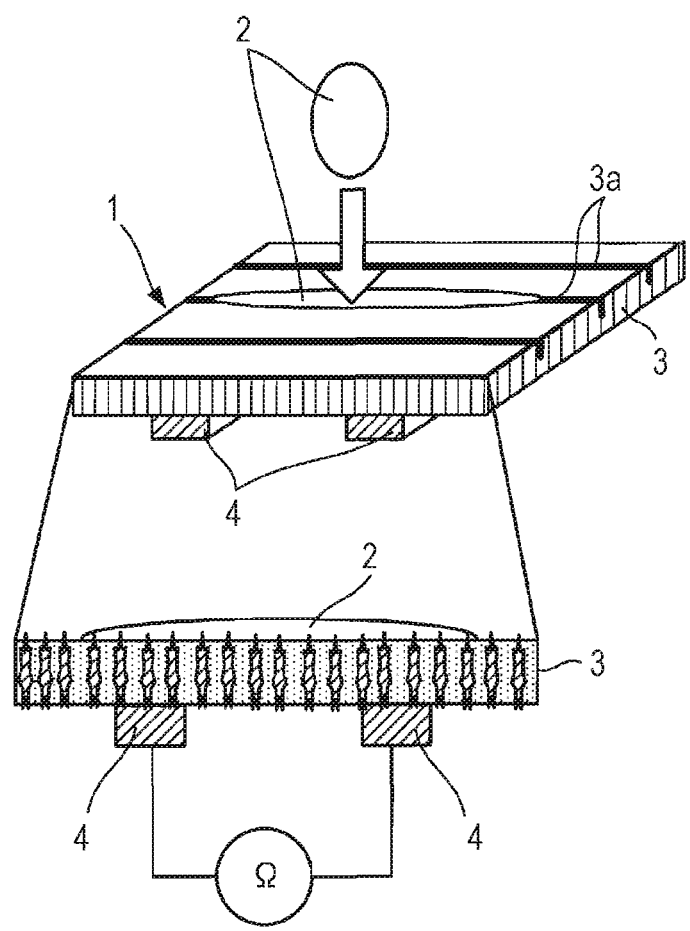
FIG. 6 is a view for describing a liquid sensing sheet having slits.

As illustrated in FIG. 6, slits 3a extending in a direction crossing the direction of extending the conductive members 4 may be formed at the first surface of the anisotropically-conductive sheet 3. In a case where the sensing target object 2 is the liquid, when the liquid adheres to the first surface of the anisotropically-conductive sheet 3, such liquid flows along the slits 3a, and expands in the direction crossing the conductive members 4. Thus, even a small amount of liquid can be sensed.

Figure 7:
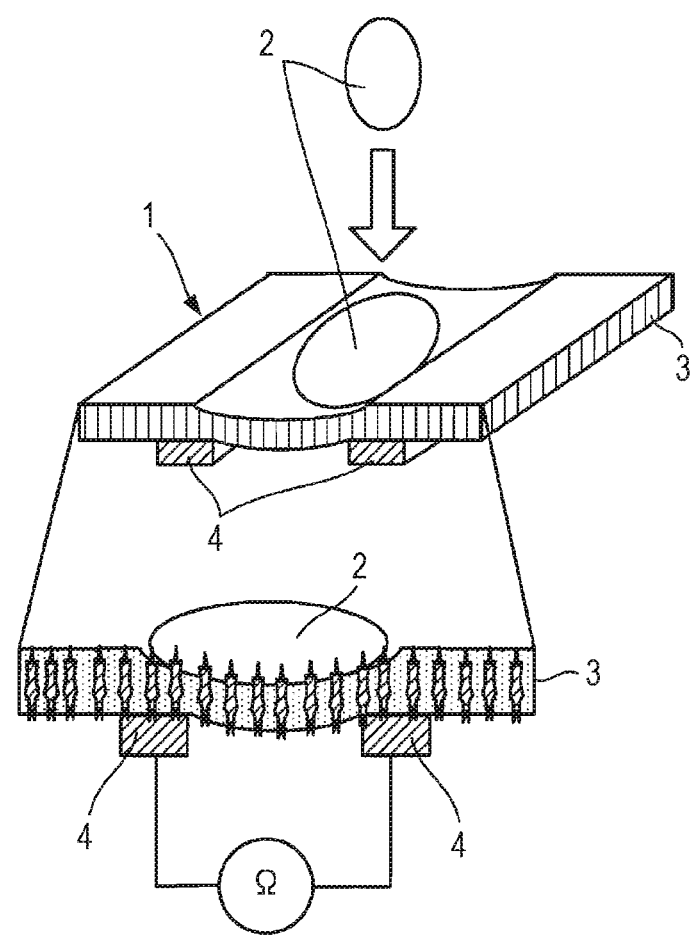
FIG. 7 is a view for describing a liquid sensing sheet having a recessed portion.

As illustrated in FIG. 7, the anisotropically-conductive sheet 3 may be formed in a recessed shape to have a top portion between the conductive members 4. In this case, when the sensing target object 2 is the liquid, the liquid flows along a recessed wall surface of the anisotropically-conductive sheet, and is accumulated in the top portion. Thus, the liquid can be sensed over a longer period of time as compared to a case where the liquid flows out of the anisotropically-conductive sheet 3.

(Sheet Sensor 1: Conductive Member 4)

As illustrated in FIG. 1, the conductive members 4 are each formed linearly, and are arranged in parallel. Moreover, the direction of extending the linear conductive members 4 is set to a direction perpendicular to a parallel direction of the conductive members 4. Thus, the sheet sensor 1 has the same sectional structure at an optional position along the direction of forming the linear conductive members 4. As a result, even in the case of cutting to a desired length at an optional position in the direction of extending the conductive members 4, multiple sheet sensors 1 with the same performance can be obtained.

Figure 8:
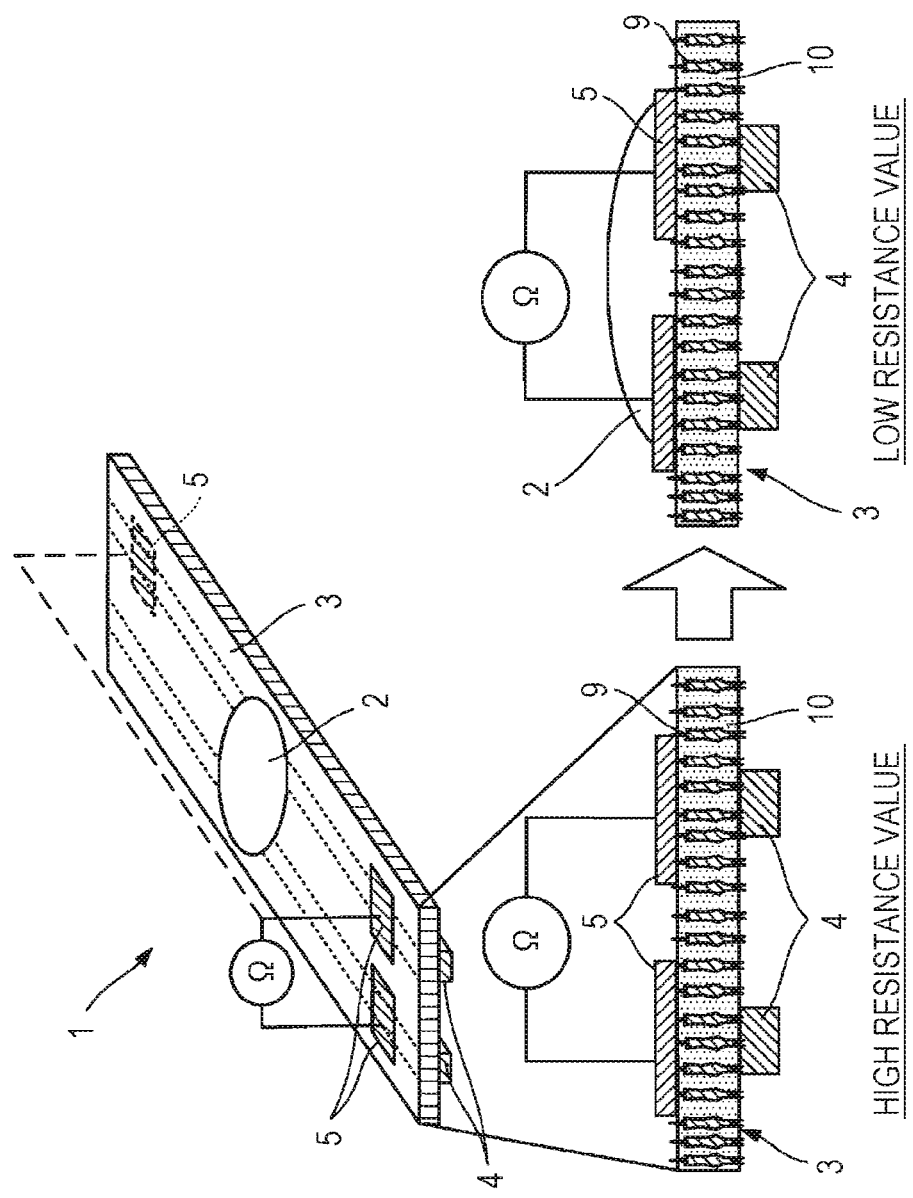
FIG. 8 is a view for describing sensing contact points of a liquid sensing sheet.

As illustrated in FIG. 8, all contact portions between each conductive member 4 and the anisotropically-conductive sheet 3 are electrically exposed at the second surface of the anisotropically-conductive sheet 3. Thus, optional positions of the contact portions between each conductive member 4 and the anisotropically-conductive sheet 3 can be set as sensing contact points 5. Moreover, the direction of extending the conductive members 4 is set to the direction perpendicular to the parallel direction of the conductive members 4. Thus, the sheet sensor 1 having the conductive members 4 formed linearly is obtained. Consequently, the sheet sensor 1 can be formed in a tape shape having a short side coincident with the parallel direction of the conductive members 4 and a long side coincident with the direction of extending the conductive members 4. With this configuration, the sheet sensor 1 can be stored and delivered with the sheet sensor 1 being wound in a roll shape.

Figure 9:
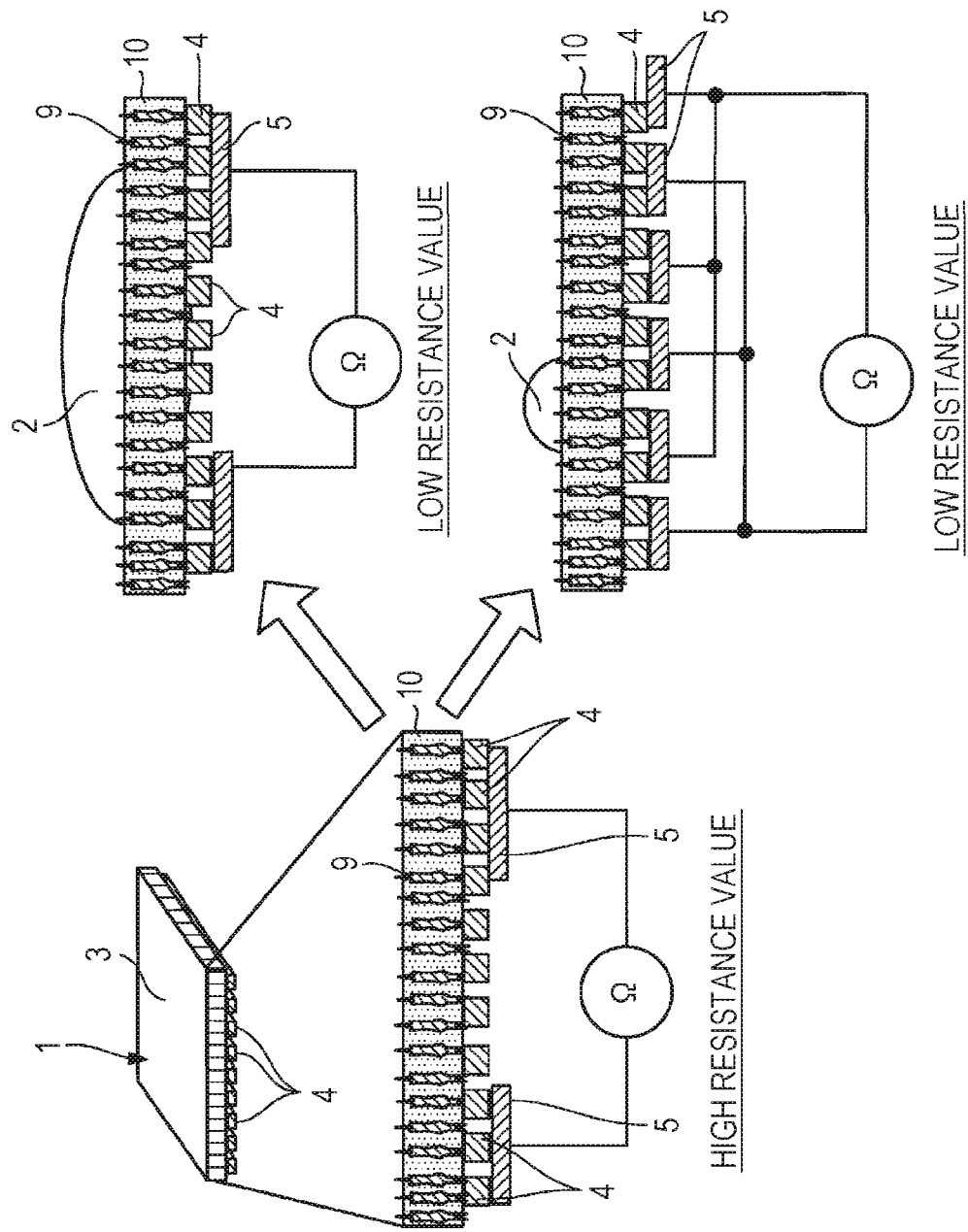
FIG. 9 is a view for describing sensing contact points of a liquid sensing sheet.
Figure 10:
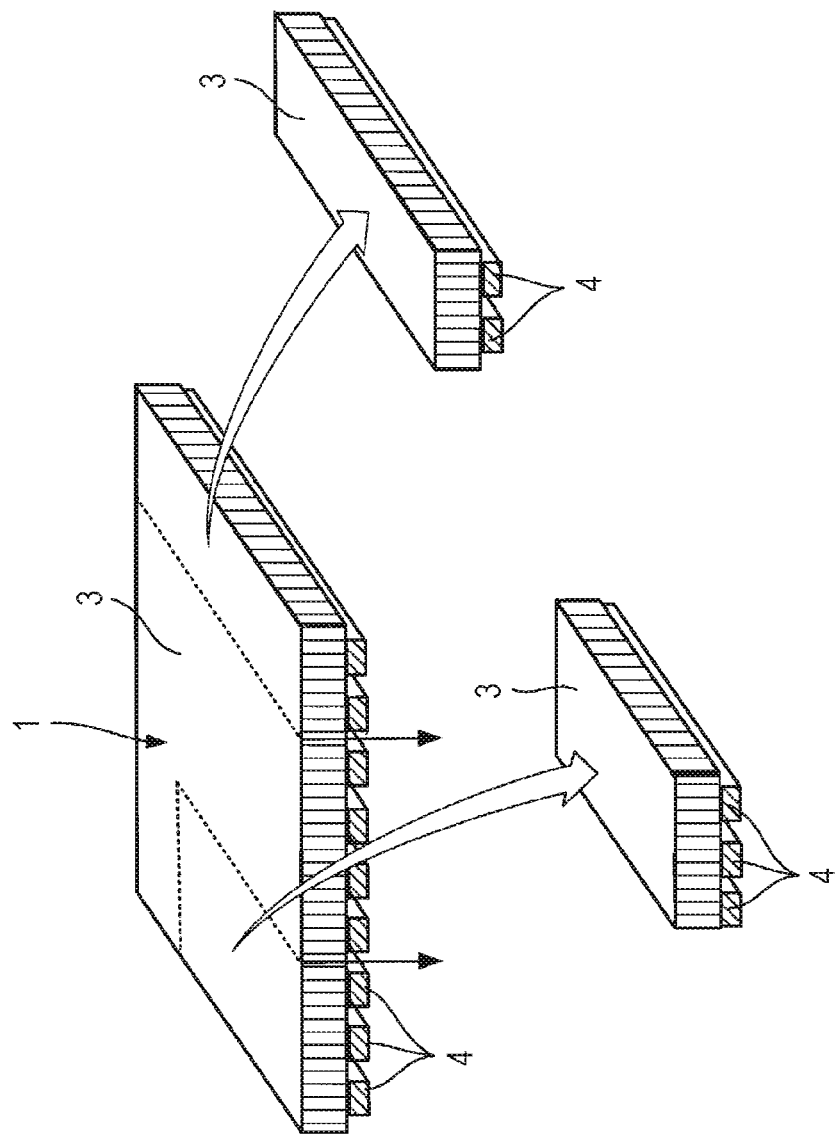
FIG. 10 is a view for describing the direction of cutting off a liquid sensing sheet.

The number of parallel conductive members 4 may be two or more. For example, as illustrated in FIG. 9, the conductive members 4 may be each formed linearly, and may be arranged in parallel from one end side to the other end side in a width direction of the anisotropically-conductive sheet 3. Note that the conductive members 4 are preferably arranged at equal interval. In this case, two selected groups of one or more conductive members 4 can be used as the sensing contact points 5. Thus, the sheet sensor 1 can be obtained, which is configured so that the sensing target object 2 can be sensed at an optional position of a surface expanding in the direction of arraying the conductive members 4 and the direction of extending the conductive members 4. Moreover, in the case of this configuration, a sensing size of the sensing target object 2 can be set by adjustment of an interval between the sensing contact points 5. That is, the sensing size of the sensing target object 2 can be set using the interval between the conductive members 4 as the minimum unit of the sensing size. Further, the sheet sensor 1 can be obtained, which has a desired size and includes a desired number of conductive members 4 by cutting at an optional position along the parallel direction of the conductive members 4 and the direction of forming the conductive members 4 as illustrated in FIG. 10.

Figure 11:
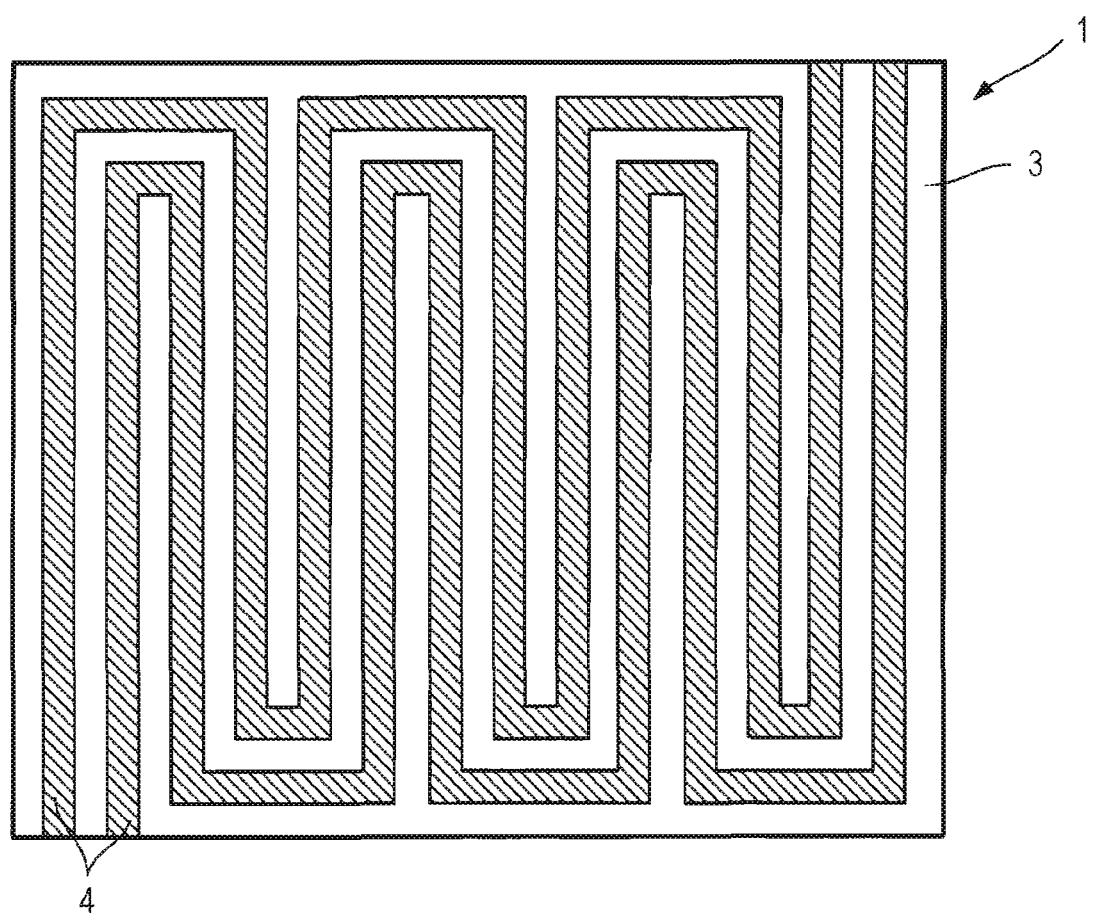
FIG. 11 is a view for describing arrangement of conductive members of a liquid sensing sheet.

In description above, the configuration in which the conductive members 4 are formed linearly to extend in the direction perpendicular to the parallel direction of the conductive members 4, i.e., in the same direction, has been described. Note that the configuration of the sheet sensor 1 of the present embodiment is not limited to this configuration. As long as the conductive members 4 and the parallel state thereof are maintained, a configuration with a combination of the linear conductive members 4 extending in different directions is also allowed. Moreover, a configuration with a combination of the linear conductive members 4 and curved conductive members 4 or a configuration with a combination of curved conductive members 4 having different curvatures is also allowed. For example, as illustrated in FIG. 11, in the case of the combination of the linear conductive members 4 extending in the different directions, a pair of conductive members 4 is formed in a square wave shape so that the conductive members 4 can be arranged across the entire surface of the rectangular anisotropically-conductive sheet 3.

Figure 12:
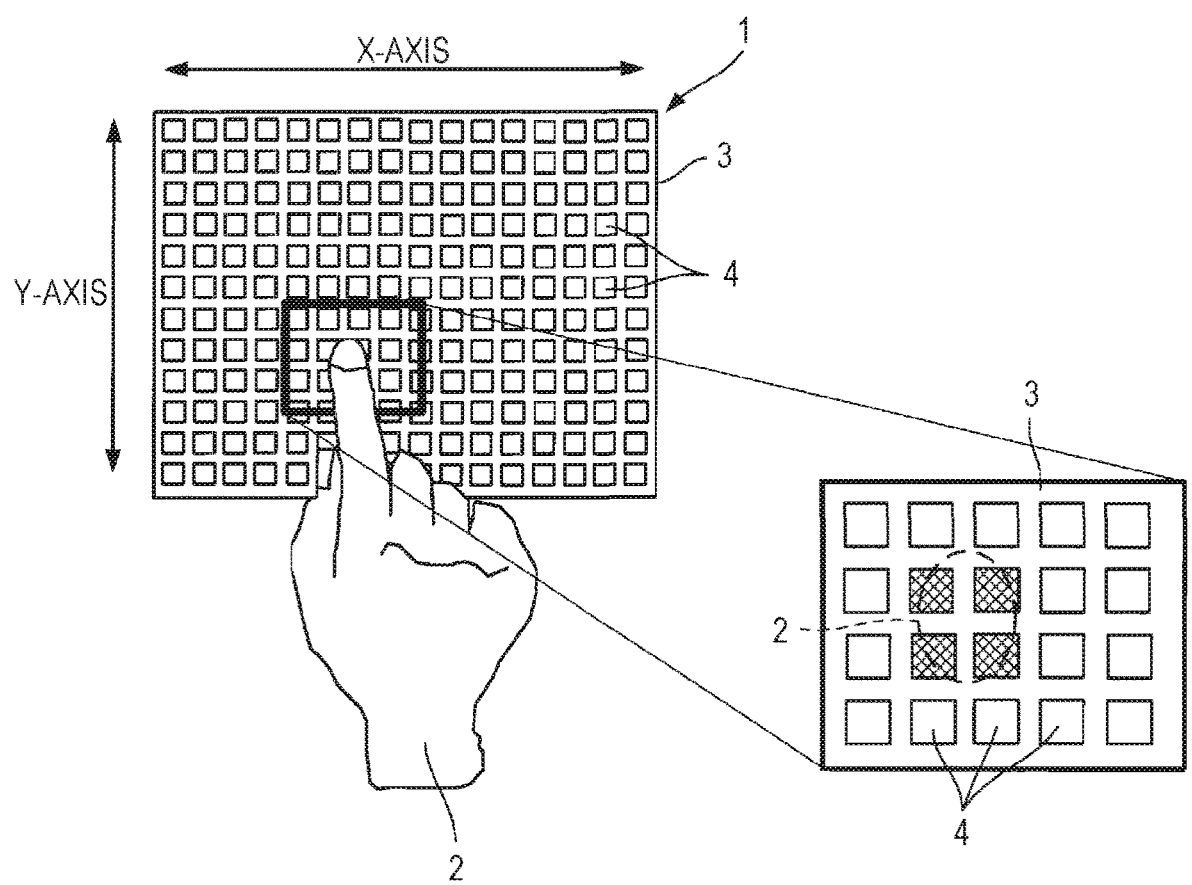
FIG. 12 is a view for describing arrangement of conductive members of a liquid sensing sheet.

Further, flat plate-shaped conductive members 4 may be dispersively arranged. For example, as illustrated in FIG. 12, in the case of dispersively arranging the multiple conductive members 4, the size or shape of the sensing target object 2 can be determined based on the number or arrangement shape of conductive members with a small electric resistance value. Moreover, based on the arrangement positions of the conductive members 4 with a small electric resistance value, the position of the sensing target object 2 in a coordinate plane having an X-axis and a Y-axis can be determined.

Figure 13:
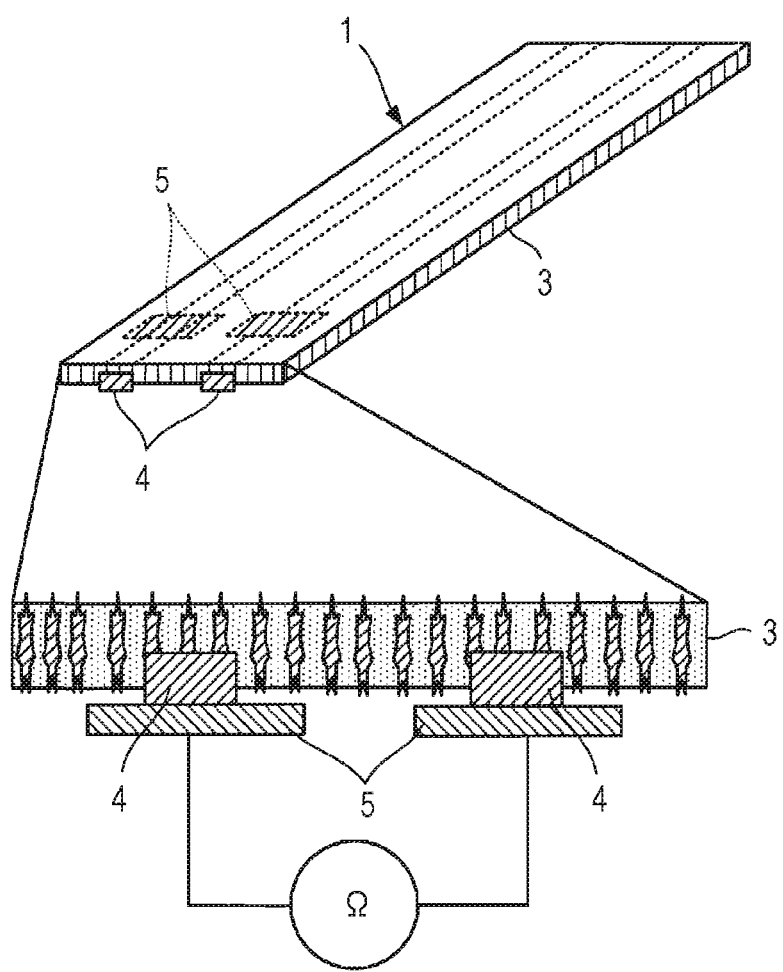
FIG. 13 is a view for describing a relationship among conductive members and an anisotropically-conductive sheet of a liquid sensing sheet.
Figure 14:
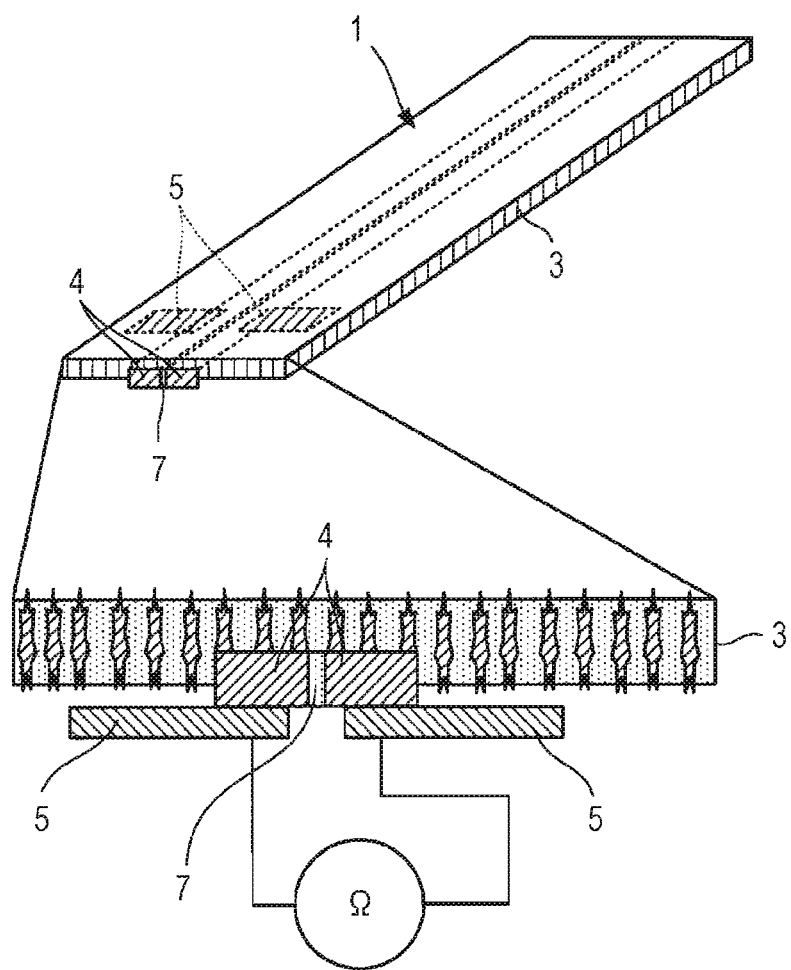
FIG. 14 is a view for describing conductive members of a liquid sensing sheet.

Note that the example where the conductive members 4 are connected to the second surface of the anisotropically-conductive sheet 3 has been described as the present embodiment. Note that the present embodiment is not limited to this example. That is, as illustrated in FIG. 13, at least part of each conductive member 4 may be embedded in the anisotropically-conductive sheet 3. In this case, the conductive members 4 are held and fixed by the anisotropically-conductive sheet 3. Thus, strength against vibration and impact can be enhanced. Further, as illustrated in FIG. 14, the conductive members 4 may contact each other via an insulating film 7. In this case, a clearance between the conductive members 4 can be narrowed to the thickness of the insulating film 7. Thus, the size of the sheet sensor 1 can be reduced.

As long as the conductive member 4 exhibits the conductivity, the conductive member 4 may be made of any material. Note that such a material is preferably metal such as aluminum or copper. Examples of the metal material forming the conductive member 4 include any of nickel, copper, silver, tin, gold, palladium, aluminum, chromium, titanium, and zinc and alloy containing two or more of these metals.

Alternatively, the conductive member 4 may be metal foil. In the case, the electric resistance can be decreased, and a sensing time can be shortened.

The conductive member 4 is not limited to metal foil obtained by rolling and metal foil (special electrolytic copper foil etc.) obtained by electrolysis. The conductive member 4 may be a thin metal film. This thin metal film may be formed by vacuum deposition, sputtering, a CVD method, metal organic (MO), plating, or a printing method.

Alternatively, the conductive member 4 may be formed from an isotropically-conductive adhesive. In this case, the conductive member 4 can be formed in such a manner that the anisotropically-conductive sheet 3 is coated by the isotropically-conductive adhesive. Thus, the sheet sensor 1 can be easily obtained. The isotropically-conductive adhesive is a mixture of conductive particles and adhesive resin. Moreover, this adhesive can be heated and pressure-bonded at 100 to 200° C. The conductive particles are metal powder or low-melting metal powder having an average particle size of 2 to 50 μm. These conductive particles to be mixed are 10 to 400 parts by weight with respect to 100 parts by weight of the adhesive resin.

EXAMPLES

Hereinafter, the present disclosure will be specifically described with reference to examples, but is not limited to these examples. Unless otherwise stated, "parts" and "%" are weight scales in the examples.

(Production of Sheet Sensor)

Conductive ink was produced in such a manner that conductive particles are kneaded with at least one resin selected from acrylic-based resin, epoxy-based resin, silicon-based resin, thermoplastic elastomer-based resin, rubber-based resin, polyester-based resin, and urethane-based resin. Specifically, the liquid conductive ink was obtained in such a manner that 5.5 parts by weight of the dendrite-shaped conductive particles (an average particle size: 7 μm to 12 μm) is added to 20 parts by weight of the epoxy-based resin and 80 parts by weight of a solvent. Thereafter, an anisotropically-conductive layer was formed in such a manner that a peeling surface of a transfer film is coated by the resultant conductive ink and the resultant conductive ink is dried on the peeling surface. An anisotropically-conductive sheet A including an anisotropically-conductive layer having a thickness within a range of 10 μm to 12 μm, an anisotropically-conductive sheet B including an anisotropically-conductive layer having a thickness within a range of 17 μm to 18 μm, and an anisotropically-conductive sheet C including an anisotropically-conductive layer having a thickness within a range of 24 μm to 26 μm were produced.

Next, conductive members with a width of 1 mm were arranged in parallel at a pitch of 5 mm on a PET film with a thickness of 50 μm. After the conductive members arranged at the above-described pitch and each of the anisotropically-conductive sheets A to C with the above-described thicknesses have been stacked on each other, thermal compression bonding (140° C. to 150° C.×5 seconds) was performed. In this manner, a sheet sensor including the conductive members arranged in parallel at a lead pitch of 5 mm and the anisotropically-conductive sheet A, B, C with a thickness of 10 μm, 17 μm, or 24 μm was produced. Similarly, a sheet sensor including the conductive members arranged in parallel at a lead pitch of 10 mm and the anisotropically-conductive sheet A, B, C with a thickness of 10 μm, 17 μm, or 24 μm was produced.

Thereafter, non-woven fabric exhibiting hydrophilic properties was connected to a surface of the anisotropically-conductive sheet A, B, C different from a bonding surface for the conductive members. In this manner, a sheet sensor including the non-woven fabric was produced. Moreover, copper foil contact points were arranged between the non-woven fabric and the anisotropically-conductive sheet A, B, C. In this manner, a sheet sensor having the copper foil contact points and the conductive members was produced, each copper foil contact point facing a corresponding one of the conductive members. These sensors were used for a first example, a second example, and a third example.
(Measurement Results of Sheet Sensor)

An electric resistance value between the conductive members and an electric resistance value between the copper foil contact points were each measured three times for a state in which the non-woven fabric is dried and a state in which the non-woven fabric is moistened with water. Measurement results are shown in Table 1.

TABLE 1

| | | Conductivity | | | | | |
|---|---|---|---|---|---|---|---|
| | Unit: Ω | | | Measuring Instrument: AD-AS-5 DRM | | | |
| | | First Example | | Second Example | | Third Example | |
| | | Conductive Ink Layer Thickness (Anisotropically-Conductive Layer Thickness) after Drying | | | | | |
| | | A) 10-12 μm | | B 17-18 μm | | C 24-26 μm | |
| | | | | Lead Pitch | | | |
| | | Dried Non-Woven Fabric (without Water) | Moistened Non-Woven Fabric (with Dropped Water) | Dried Non-Woven Fabric (without Water) | Moistened Non-Woven Fabric (with Dropped Water) | Dried Non-Woven Fabric (without Water) | Moistened Non-Woven Fabric (with Dropped Water) |
| 5 mm | 1 | 999 or more | 128 | 999 or more | 133 | 999 or more | 382 |
| | 2 | 999 or more | 137 | 999 or more | 139 | 999 or more | 314 |
| | 3 | 999 or more | 132 | 999 or more | 146 | 999 or more | 345 |
| | Average | 999 Ω or more | 132 Ω | 999 Ω or more | 139 Ω | 999 Ω or more | 347 Ω |
| | Evaluation | x Conduction Failure | ○ Conduction Observed | x Conduction Failure | ○ Conduction Observed | x Conduction Failure | ○ Conduction Observed |
| 10 mm | 1 | 999 or more | 222 | 999 or more | 246 | 999 or more | 396 |
| | 2 | 999 or more | 158 | 999 or more | 196 | 999 or more | 376 |
| | 3 | 999 or more | 149 | 999 or more | 237 | 999 or more | 2534 |
| | Average | 999 Ω or more | 143 Ω | 999 Ω or more | 226 Ω | 999 Ω or more | 338 Ω |
| | Evaluation | x Conduction Failure | ○ Conduction Observed | x Conduction Failure | ○ Conduction Observed | x Conduction Failure | ○ Conduction Observed |

First Example

In Table 1, in a case where the anisotropically-conductive layer thickness falls within a range of 10 μm to 12 μm and the lead pitch is 5 mm, when the non-woven fabric is in the dried state, the average resistance value was equal to or greater than 999Ω. When the non-woven fabric is in the moistened state, the average resistance value was 132Ω. In a case where the anisotropically-conductive layer thickness falls within a range of 10 μm to 12 μm and the lead pitch is 10 mm, when the non-woven fabric is in the dried state, the average resistance value was equal to or greater than 999Ω. When the non-woven fabric is in the moistened state, the average resistance value was 143Ω.

Second Example

In a case where the anisotropically-conductive layer thickness falls within a range of 17 μm to 18 μm and the lead pitch is 5 mm, when the non-woven fabric is in the dried state, the average resistance value was equal to or greater than 999Ω. When the non-woven fabric is in the moistened state, the average resistance value was 139Ω. Moreover, in a case where the anisotropically-conductive layer thickness falls within a range of 17 μm to 18 μm and the lead pitch is 10 mm, when the non-woven fabric is in the dried state, the average resistance value was equal to or greater than 999Ω. When the non-woven fabric is in the moistened state, the average resistance value was 226Ω.

Third Example

In a case where the anisotropically-conductive layer thickness falls within a range of 24 μm to 26 μm and the lead pitch is 5 mm, when the non-woven fabric is in the dried state, the average resistance value was equal to or greater than 999Ω. When the non-woven fabric is in the moistened state, the average resistance value was 347Ω. Moreover, in a case where the anisotropically-conductive layer thickness falls within a range of 24 μm to 26 μm and the lead pitch is 10 mm, when the non-woven fabric is in the dried state, the average resistance value was equal to or greater than 999Ω. When the non-woven fabric is in the moistened state, the average resistance value was 338Ω.

As a result, it has been found that in the case of producing the anisotropically-conductive, sheet by means of the anisotropically-conductive ink, the anisotropically-conductive sheet exhibiting conductivity only in a thickness direction is obtained. Moreover, it has been found that the anisotropically-conductive sheet having a smaller thickness has a lower resistance value upon conduction. Further, it has been found that an anisotropically-conductive ink thickness of 17 μm is optimum.

In detailed description above, characteristic contents have been mainly described for the sake of more easy understanding of the present embodiment. Note that the present embodiment is not limited to the embodiment described in detailed description above, and is also applicable to other embodiments. The scope of application of the present embodiment shall be interpreted as broad as possible.

The terms and wording used in the present disclosure are used for appropriately describing the present embodiment. The technical scope of the present embodiment shall not be interpreted in a limited manner on the ground of these terms and wording. Moreover, it is assumed that those skilled in the art can conceive, from the concept grasped from the present embodiment, other configurations, systems, or methods contained in the concept. Thus, it shall be recognized that the subject matter of the invention described in the claims includes a subject matter of an equivalent configuration without departing from the technical idea of the present disclosure. Moreover, it is desired to sufficiently understand the object of the present disclosure and the advantageous effects of the present embodiment with reference to literatures etc. disclosed already.

The sheet sensor of the present disclosure may be the following first to twelfth sheet sensors.

The first sheet sensor includes an anisotropically-conductive sheet exhibiting conductivity in a thickness direction and having one surface as a contact surface for a sensing target object, and multiple conductive members electrically connected to another surface of the anisotropically-conductive sheet and electrically insulated from each other.

The second sheet sensor is the first sheet sensor in which the conductive members are each formed linearly and are arranged in parallel, and the direction of forming the conductive members is set to a direction perpendicular to a parallel direction of the conductive members.

The third sheet sensor is the first sheet sensor in which the conductive members are each formed linearly and are arranged in parallel from one end side to the other end side in a width direction of the anisotropically-conductive sheet.

The fourth sheet sensor is the third sheet sensor in which the one surface of the anisotropically-conductive sheet exhibits hydrophilic properties.

The fifth sheet sensor the third sheet sensor further including a layer formed from non-woven fabric on the one surface of the anisotropically-conductive sheet.

The sixth sheet sensor is the third sheet sensor further including a slit extending, at the one surface of the anisotropically-conductive sheet, in a direction crossing the conductive members.

The seventh sheet sensor s the first sheet sensor n which the anisotropically-conductive sheet is formed in a recessed shape to have a top portion between the conductive members.

The eighth sheet sensor is the first sheet sensor further including an insulating sheet connected to the other surface of the anisotropically-conductive sheet, the conductive members being sandwiched between the anisotropically-conductive sheet and the insulating sheet.

The ninth sheet sensor is the first sheet sensor in which at least part of each conductive member is embedded in the anisotropically-conductive sheet.

The tenth sheet sensor is the ninth sheet sensor n which the conductive members contact each other via an insulating film.

The eleventh sheet sensor is the first sheet sensor in which the anisotropically-conductive sheet includes multiple conductive particles arranged dispersively and sheet-shaped insulating resin, one and another portions of each conductive particle being exposed at the one surface and the other surface of the anisotropically-conductive sheet.

The twelfth sheet sensor includes a pair of anisotropically-conductive sheets exhibiting conductivity in a thickness direction and stacked on each other in the thickness direction, and multiple conductive members arranged between the anisotropically-conductive sheets. The conductive members are electrically connected to the anisotropically-conductive sheets, and are electrically insulated from each other.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A sheet sensor comprising: a pair of anisotropically-conductive sheets exhibiting conductivity in a thickness direction, one of the anisotropically-conductive sheets having a first surface as a contact surface for a sensing target object; and multiple conductive members arranged between the anisotropically-conductive sheets, electrically connected to a second surface of the one of the anisotropically-conductive sheets and electrically insulated from each other, wherein the conductive members are each formed linearly, and are arranged in parallel, the conductive members extend in a direction perpendicular to the thickness direction, and the sheet sensor has a substantially uniform sectional structure along the direction of extending the conductive members.

2. The sheet sensor according to claim 1, wherein
the conductive members are each formed linearly, and are arranged in parallel from one end side to the other end side in a width direction of the anisotropically-conductive sheet.

3. The sheet sensor according to claim 2, wherein
the first surface of the anisotropically-conductive sheet exhibits a hydrophilic property.

4. The sheet sensor according to claim 2, further comprising:
a layer formed from non-woven fabric on the first surface of the anisotropically-conductive sheet.

5. The sheet sensor according to claim 2, further comprising:
a slit extending, at the first surface of the anisotropically-conductive sheet, in a direction crossing the direction of extending the conductive members.

6. The sheet sensor according to claim 1, wherein
the anisotropically-conductive sheet is formed in a recessed shape to have a top portion between the conductive members.

7. The sheet sensor according to claim 1, wherein
at least part of each conductive member is embedded in the anisotropically-conductive sheet.

8. The sheet sensor according to claim 7, wherein
the conductive members contact each other via an insulating film.

9. The sheet sensor according to claim 1, wherein
the anisotropically-conductive sheet includes sheet-shaped insulating resin containing multiple conductive particles arranged dispersively, wherein
first and second portions of each conductive particle are exposed at the first and second surfaces of the anisotropically-conductive sheet.

* * * * *